US012317455B2

(12) United States Patent
Bean, Jr.

(10) Patent No.: US 12,317,455 B2
(45) Date of Patent: May 27, 2025

(54) INFORMATION TECHNOLOGY EQUIPMENT COOLING SYSTEM AND RELATED METHODS

(71) Applicant: SCHNEIDER ELECTRIC IT CORPORATION, Foxboro, MA (US)

(72) Inventor: John H. Bean, Jr., Littlestown, PA (US)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 1059 days.

(21) Appl. No.: 16/778,326

(22) Filed: Jan. 31, 2020

(65) Prior Publication Data

US 2021/0212237 A1 Jul. 8, 2021

Related U.S. Application Data

(60) Provisional application No. 62/957,838, filed on Jan. 7, 2020.

(51) Int. Cl.
*H05K 7/20* (2006.01)
(52) U.S. Cl.
CPC ....... *H05K 7/2079* (2013.01); *H05K 7/20145* (2013.01); *H05K 7/20172* (2013.01); *H05K 7/20263* (2013.01); *H05K 7/20272* (2013.01); *H05K 7/20745* (2013.01)
(58) Field of Classification Search
CPC ............. H05K 7/2079; H05K 7/20145; H05K 7/20745; H05K 7/20172; H05K 7/20263; H05K 7/20272
See application file for complete search history.

(56) References Cited

U.S. PATENT DOCUMENTS

| | | | | |
|---|---|---|---|---|
| 3,988,900 A | * | 11/1976 | Kamata ................ | F24F 1/0087 454/236 |
| 9,629,286 B2 | * | 4/2017 | Campbell .......... | H05K 7/20781 |
| 2009/0268404 A1 | * | 10/2009 | Chu .................... | H05K 7/20745 361/698 |
| 2017/0118874 A1 | * | 4/2017 | Lin .................... | H05K 7/20818 |

FOREIGN PATENT DOCUMENTS

| | | | | |
|---|---|---|---|---|
| EP | 3225925 A1 | * | 10/2017 | ............ F24F 1/0018 |
| JP | 2007178116 A | * | 7/2007 | |
| JP | 2007178816 A | * | 7/2007 | |

OTHER PUBLICATIONS

Translated_Mitsukazu (Year: 2007).*

* cited by examiner

*Primary Examiner* — Elizabeth J Martin
*Assistant Examiner* — Samba Nmn Gaye
(74) *Attorney, Agent, or Firm* — Lando & Anastasi, LLP

(57) ABSTRACT

A system to cool fluid used in information technology equipment (ITE) includes an enclosure having a supply inlet configured to receive supply air from an HVAC supply source and a heat exchanger in fluid communication with at least one ITE unit by a supply line configured to deliver cooled cooling fluid to the at least one ITE unit and a return line configured to deliver warmed cooling fluid to the heat exchanger. The supply air is directed at the heat exchanger to cool the cooling fluid provided in the at least one ITE unit.

19 Claims, 4 Drawing Sheets

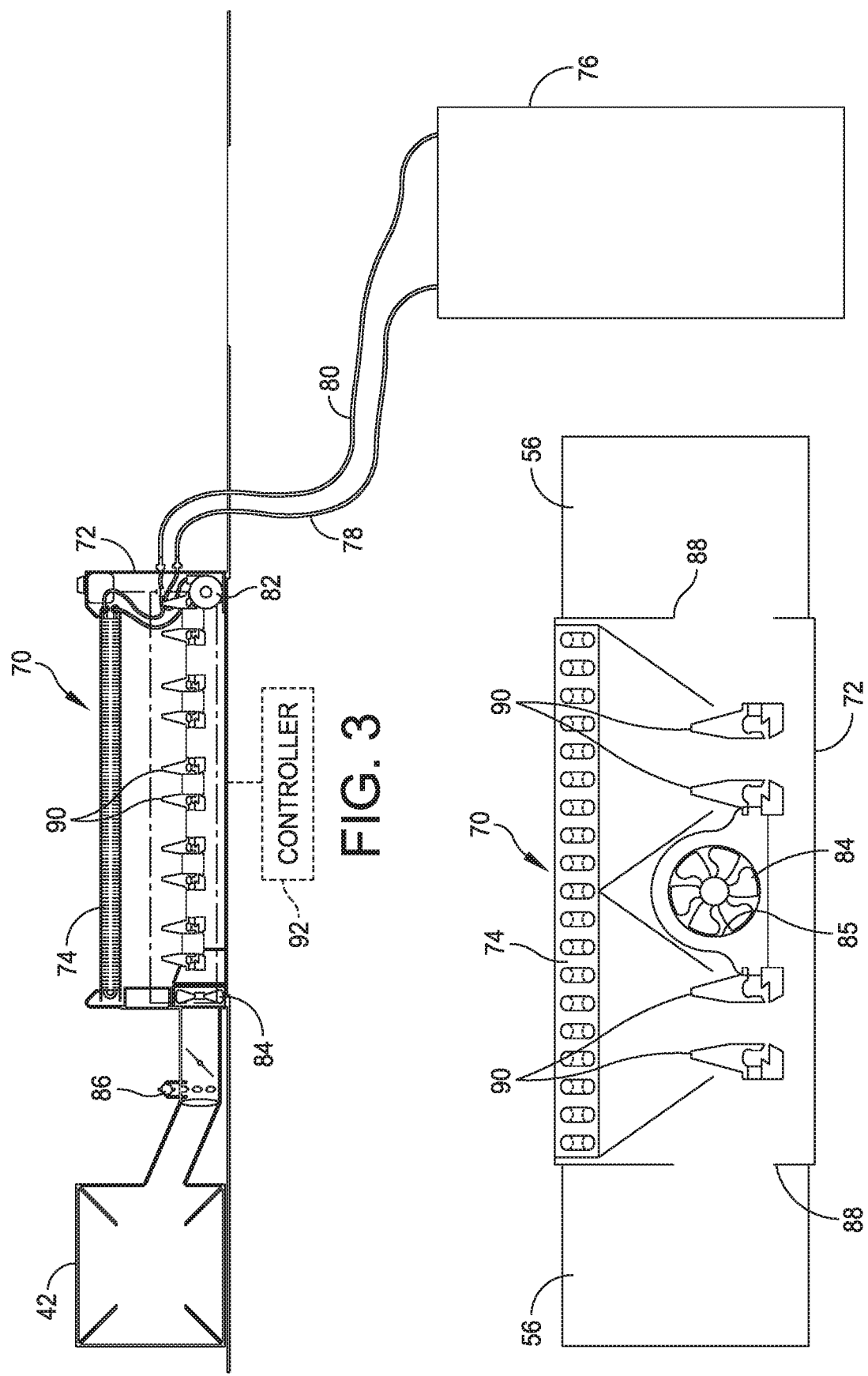

INFORMATION TECHNOLOGY EQUIPMENT COOLING SYSTEM AND RELATED METHODS

CROSS-REFERENCE TO RELATED APPLICATIONS

This application claims priority to U.S. Provisional Patent Application No. 62/957,838 filed Jan. 7, 2020, entitled INFORMATION TECHNOLOGY EQUIPMENT COOLING SYSTEM AND RELATED METHODS, which is incorporated by reference herein in its entirety.

BACKGROUND OF DISCLOSURE

1. Field of Disclosure

Aspects of the present disclosure relate generally to data centers, including microdata centers, small rooms and closets, that contain racks and enclosures used to house data processing, networking and telecommunications equipment, and more particularly to cooling systems and methods used to cool equipment housed by such racks and enclosures.

2. Discussion of Related Art

In commercial buildings, spaces are often cooled and heated by a relatively large air handling unit (AHU) that is configured to feed treated air to several variable air volume (VAV) units/boxes spread throughout the building to address localized (zoned) heating and cooling loads. These systems often operate in accordance with a scheduled mode of operation, e.g., occupied, evening, weekends and holidays, and may include significant setback and/or alteration of behavior from a normal occupied mode. Depending on the operation mode, supply air pressure and temperature may vary thereby effecting the control of the AHU and the VAV units.

The concept of liquid cooling of information technology equipment (ITE) for "micro" data center solutions is relatively new. Heat rejection or heat of rejection is heat from a cooling system which is dissipated by a condenser, dry-cooler, cooling tower, fresh air system, etc. Heat rejection is the total amount of heat energy which is transferred from a warm side to a cool side, including the work carried out by various components of the cooling system, e.g., compressor(s), fan(s), pump(s), etc. Existing cooling solutions for liquid cooling of ITE range from a fully independent cooling system with an outdoor dry-cooler or cooling towers (potentially expensive with many fit-out challenges) to a very simple fan/coil dry-cooler mounted within the same room as the ITE, the later having a distinct possibility of creating local hot spots.

SUMMARY OF DISCLOSURE

One aspect of the present disclosure is directed to a system to cool fluid used in information technology equipment (ITE). In one embodiment, the system comprises an enclosure including a supply inlet configured to receive supply air from an HVAC supply source and a heat exchanger in fluid communication with at least one ITE unit by a supply line configured to deliver cooled cooling fluid to the at least one ITE unit and a return line configured to deliver warmed cooling fluid to the heat exchanger. The supply air is directed at the heat exchanger to cool the cooling fluid provided in the at least one ITE unit.

Embodiments of the system further may include configuring the enclosure to have at least one return inlet to receive return air from at least one zone. The system further may include a fan module configured to draw supply air into the enclosure. The fan module may be positioned within the supply inlet of the enclosure. The system further may include a fan module configured to draw return air into the enclosure. The system further may include a damper configured to control a volume of supply air entering the enclosure. A proportion of supply air from the HVAC supply source and return air from the at least one zone to the enclosure may be about one-third (⅓) supply air to about two-thirds (⅔) return air. The enclosure may be configured to be mounted within a ceiling space. The at least one return inlet may be positioned beneath the heat exchanger to create an area of low pressure to draw warmer return air into the enclosure. The cooling unit further may include at least one amplifier nozzle configured to direct supply air and/or return air to the heat exchanger. The at least one amplifier nozzle may be controlled by a controller. The system further may include supplemental cooling provided by a thermo electric cooler. The thermo electric cooler may be supported by the enclosure. The thermo electric cooler may be controlled by a controller.

Another aspect of the disclosure is directed to a method of installing a cooling unit within a heating ventilation and air condition system. In one embodiment, the method comprises: providing a cooling unit including an enclosure and a heat exchanger. The heat exchanger is configured to be in fluid communication with at least one information technology equipment (ITE) unit by a supply line configured to deliver cooled cooling fluid to the at least one ITE unit and a return line configured to deliver warmed cooling fluid to the heat exchanger. The enclosure of the cooling unit is configured to receive supply air from an HVAC supply source and to direct the supply air to the heat exchanger to cool the cooling fluid provided from the at least one ITE unit.

Embodiments of the method further may include configuring the enclosure to receive return air from at least one zone. A proportion of supply air from the HVAC supply source and return air from the at least one zone to the enclosure may be about one-third (⅓) supply air to about two-thirds (⅔) return air. The cooling unit may be configured to draw air from at least one of the supply air or the return air into the enclosure by a fan module. The cooling unit may be configured to direct supply air to the heat exchanger by at least one air amplifier.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 3 is a cross-sectional view of the cooling unit connected to a supply duct of the AHU and the ITE;

FIG. 4 is an enlarged cross-sectional view of the cooling unit taken along another axis.

DETAILED DESCRIPTION

Figure 1:
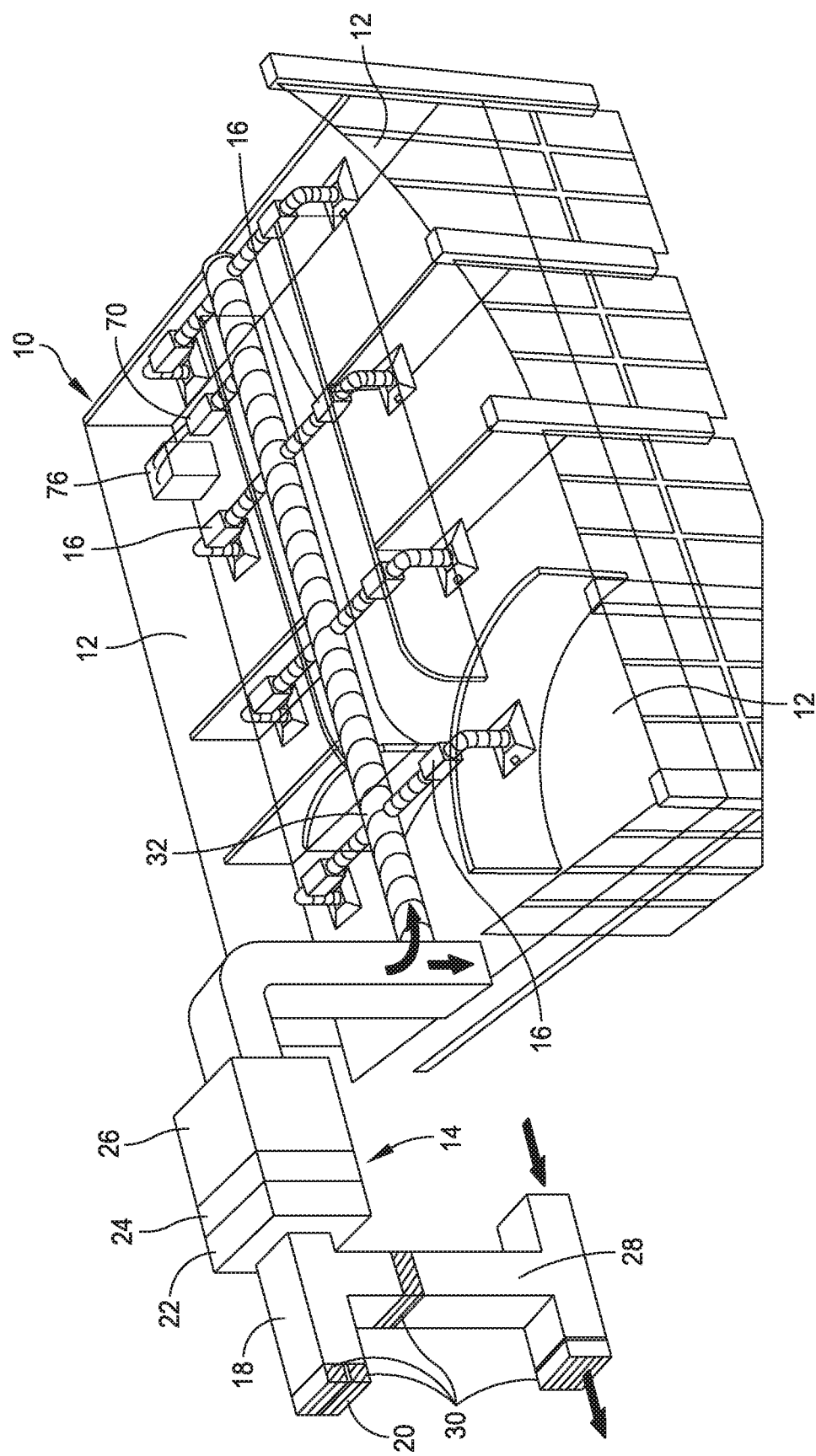
FIG. 1 is a perspective schematic illustration of a portion of a building space that is cooled and heated by an air handling unit (AHU) that is connected to a plurality of variable air volume (VAV) units/boxes provided in the space.

The present disclosure is directed to improving efficiency and enhances practicality of a system that cools fluid for cooling IT equipment. The system includes a cooling unit that takes in air that was previously cooled by a heating, ventilation and air conditioning (HVAC) system to cool a heat exchanger of the cooling unit. In one embodiment, the cooling unit is positioned within a space above a ceiling within the building.

One type of system used to cool a building is called a variable air volume (VAV) system. The component that pushes air from the outdoors, recirculated air or combination thereof into individual rooms/zones is called an air handler unit (AHU). The air supplied to each zone is the supply air, and the air returned to the AHU or exhaust from the zones is the return air. The supply air gets cooled or heated by one or more coils/devices of the AHU system for the supply air is suppled to a zone VAV to condition the zone. The air supplied may be cooler than water to be cooled from the ITE. This allows the supplied air to be used for means of passive heat of rejection from the cooling device.

The system may connect supply air ducts and/or return air ducts or plenums with the cooling unit having a conduit that carries fluid to and from the heat exchanger. Supply air may be drawn and/or pushed in and, if needed, boosted in pressure for primary air within the cooling unit using a fan, and the building return air/secondary air within the cooling unit is sucked in with air amplifiers and/or by using another one or more fan. An air amplifier is a device that takes pressurized air and exhausts it out, through an orifice (e.g., annular orifice), toward a target. In the process of exhausting, the air amplifier pulls in surrounding air volume. The rate at which the air amplifier multiplies the air volume moved is the amplification ratio. Air amplifiers may be used to move air toward a target for the purposes of quickly cooling the target.

Embodiments of the present disclosure are directed to a hybrid system and method having a dedicated cooling unit to treat coolant used to provide liquid cooling to information technology equipment (ITE). Specifically, the cooling unit includes a heat exchanger embodying an air-cooled radiator that provides cooling to the liquid cooled ITE. The radiator, e.g., a coil or conduit having fins, is mounted in an enclosure or support housing of the cooling unit, which is positioned in the return air plenum of the building's heating, ventilation and air conditioning (HVAC) system. The return air plenum may be a space between the building's drop ceiling and upper ceiling. Embodiments may use a mixture of the air handling unit (AHU) supply air (cooler air) and ceiling return air (warmer air) to absorb heat of rejection of the air-cooled radiator. Although warmer, the ceiling return air is cooler than the warmed fluid within the air-cooled radiator and thus capable of cooling the warmed fluid within the air-cooled radiator. In one embodiment, a preferred proportion of supply air and return air to the cooling unit is one-third (⅓) AHU supply air to two-thirds (⅔) return air.

In one embodiment, the cooling unit may include an in-line inlet booster fan for the variable air volume (VAV) air being deliver by the AHUs. When the AHUs are shut off, the booster fan may operate to draw air from the building as the primary cooling source for the radiator serving ITE water loop. The cooling unit furthermore functions somewhat like a chilled beam in reverse. (A chilled beam is a type of HVAC system that is configured to heat and cool large buildings. In one embodiment, a chilled beam system includes pipes of water that are passed through a heat exchanger (or "beam") within a ceiling. As the beam chills the air around it, the dense air falls and is replaced by warmer air from below.) The supply air from VAV is discharged via high-velocity annular slits into cylindrical chamber(s) beneath the radiator to create an area of low pressure to draw additional warmer return air into the cooling unit with the mixture being discharge through the radiator into the greater volume of the cooling unit enclosure. The nozzles perform a function similar to an air amplifier known in the industry. The supply air from the AHU, boosted as needed by in-line booster fan, is the prime mover for all airflow through the radiator. The cooling unit further includes the possibility for active cooling elements, e.g. a thermal electric cooling (TEC) unit, pump(s), controls, reservoir, Internet connectivity, etc., to fully support liquid cooled ITE.

The adaptation of liquid cooled ITE cooling units to address and provide dedicated cooling to ITE in existing building HVAC infrastructure is challenging. If no suitable means exist to adapt an existing building cooling system, a separate secondary system may be provided at considerable cost and complexity.

Embodiments of the present disclosure are directed to a meaningful way to combine liquid cooling for ITE with existing building VAV systems.

Embodiments of the present disclosure include a combination of cool AHU supply air for VAV and warmer return air for heat of rejection.

Embodiments of the present disclosure include an in-line boost fan that can draw air from common branch ducting during off cycle of AHU to allow using the greater volume of building to dissipate thermal energy.

Embodiments of the present disclosure include a primary fan and a return air-amplifier configuration to move air from the supply air source and the return air source, respectively.

Embodiments of the present disclosure further include a thermodynamic series configuration having a trim chilling Peltier thermo electric cooler (TEC) array unit to trim cooling of water to be supplied to ITE as coolant.

This disclosure is not limited in its application to the details of construction and the arrangement of components set forth in the following description or illustrated in the drawings. The principles set forth in this disclosure are capable of being provided in other embodiments and of being practiced or of being carried out in various ways. Also, the phraseology and terminology used herein is for the purpose of description and should not be regarded as limiting. The use of "including," "comprising," "having," "containing", "involving", and variations thereof herein, is meant to encompass the items listed thereafter and equivalents thereof as well as additional items.

Referring to the drawings, and more particularly to FIG. 1, a portion of a data center is generally indicated at 10. The data center 10 can include large data centers, medium-sized data centers, microdata centers, small rooms and closets, each of which configured to contain racks and enclosures used to house data processing, networking and telecommunications equipment. As shown, the data center 10 includes a building structure having several rooms, each indicated at 12 and separated from one another by walls and/or partitions. Heating and cooling of the rooms 12 of the data center 10 is achieved by a HVAC system having an AHU generally indicated at 14 that feeds a plurality of VAV units each indicated at 16 that are positioned above the rooms. The VAV units 16 can be positioned in any desirable locations to provide heating and cooling of the rooms 12. The rooms 12 may include data center equipment, including ITE, which may require dedicated cooling.

In some embodiments, the VAVs may include a supplemental means to heat air as needed for an associated zone as air temperature from the AHU may not be warm enough to address zones with high heating demand. The supplemental heating devices with the VAV commonly may include electric heaters, hot water coils or low-pressure steam coils.

As shown, the AHU 14 is connected to an inlet duct 18 on one side of the unit, the inlet duct having an outside air inlet 20 that is connected to the AHU. In one embodiment, the AHU 14 includes a large bank of filters 22 to filter the inlet air entering the AHU through the inlet duct 18, an optimally sized heat exchanger 24 to heat or cool the inlet air as desired, and a high-efficiency fan 26 with a high-efficiency motor and a variable-speed drive to move the inlet air through the system. The inlet duct 18 is further connected to a return air duct 28 to reintroduce at least a portion of the return air to the AHU 14. Air entering the AHU 14 is controlled by several dampers, each indicated at 30, which are configured to control an amount of air entering the AHU from the outside environment through the outside air inlet 20 and from the return air duct 28.

The AHU 14 is connected to a supply duct 32 provided on the other side of the unit. In one embodiment, the supply duct 32 is a large, low-pressure round or oval static-regain duct. The supply duct 32 is configured to deliver treated (e.g., cooled) air from the AHU 14 to the VAV units 16, which are configured to treat air within the rooms or dedicated sections or portions of the data center 10. The arrangement is such that cooled air generated by the AHU 14 travels though the supply duct to the VAV units 16 provided above or within the rooms. The return air duct 28 is configured to gather warmed air from the rooms of the building and to return the warmed air to the AHU 14. As shown, some of the warmed air may be vented to the outside environment by the damper 30.

Figure 2:
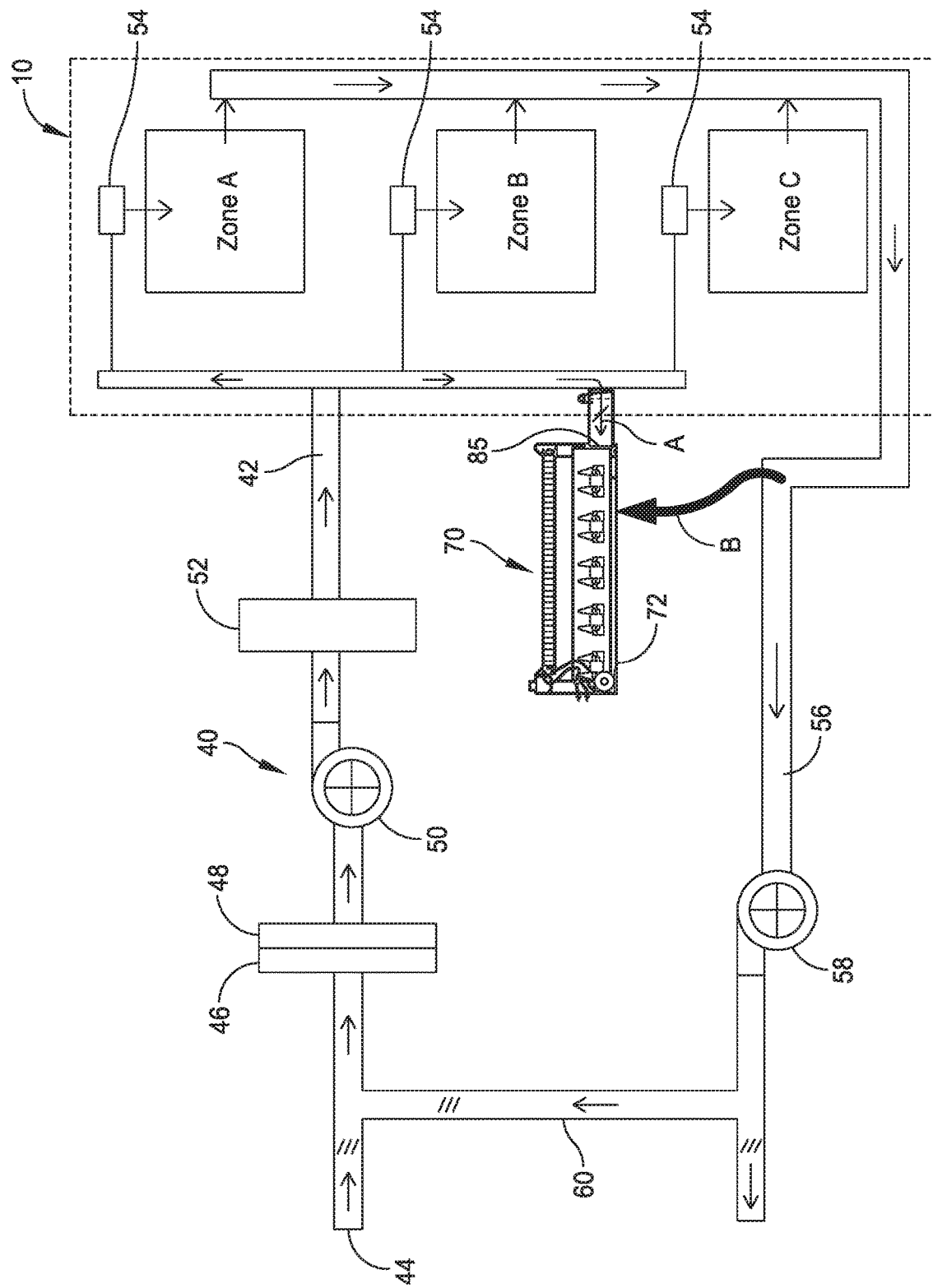
FIG. 2 is a schematic illustration of the portion of the building space having the VAV units, and a cooling unit of an embodiment of the present disclosure that is provided to cool information technology equipment (ITE)

Referring to FIG. 2, a typical variable air volume system is generally indicated at 40. As shown, the system 40 includes a supply duct 42 configured to deliver cooled supply air to the rooms of the data center 10. The system further includes an inlet duct 44 to receive outside air into the system. The air in the inlet duct 44 passes to a filter 46 and a heat exchanger 48 to preheat the air. A variable speed supply fan 50 is provided in the system 40 to move the air through another heat exchanger 52 embodying a cooling coil that is configured to cool the air to approximately 55° F. Once treated, the cooled air enters into one of several VAV units, each indicated at 54, via the supply duct 42 with each VAV unit being provided to cool a certain zone. The arrangement is such that the cooled air is directed to the zone where the air cools the zone. Air warmed in the zone is drawn through a return plenum 56 by a variable speed return fan 58 and either exhausted to the environment or directed to the inlet duct 44 via duct 60. In some embodiments, a return duct (not shown) may suck air out of return plenum 56 and direct it to AHU 14 and/or the outdoors. In one embodiment, the return plenum 56 can be the space between a false ceiling and an existing ceiling (e.g., where components of the variable air volume system 40 operate). In another embodiment, the return plenum 56 can be a dedicated duct (e.g., a return duct).

Exemplary embodiments of the present disclosure are directed to a cooling unit, generally indicated at 70, that is provided to deliver dedicated cooling to ITE within the data center 10. Cooling unit 70 may be within a return air plenum 56. Cooled air is directed from the supply duct 42 into the cooling unit 70 via a supply inlet 85 as indicated by arrow A. The supply duct 42 is an example of an HVAC supply source. Instead or in addition, warmed air may be directed from the return plenum 56 into the cooling unit via return inlet(s) (shown in FIG. 2) as indicated by arrow B. As shown, the cooling unit 70 is in fluid communication with the supply duct 42, which carries cooled air, e.g., 55° F., and the return plenum 56, which carries warmed air, e.g., 75° F. In some embodiments, return plenum 56 may be a return duct. For example, the cooling unit 70 may receive return air through a return duct. The cooling unit 70 is able to use a combination of relatively cool AHU supply air and relatively warm ceiling return air and mix the two air sources, the mixture of air being cooler than water from the ITE, to absorb heat of rejection of the cooling unit 70 generated by a heat exchanger 74 of the cooling unit in the manner described below. In some embodiments, a preferred proportion of supply air and return air to the cooling unit 70 may be one-third (⅓) AHU supply air to two-thirds (⅔) return air. However, other proportions can be employed depending on environmental conditions and cooling requirements. For example, only AHU supply air may be used to cool the heat exchanger 74. In another example, only ceiling return air may be sued to cool the heat exchanger 74. The proportions may be selected based on operating conditions, e.g., outdoor temperature, room temperature and/or energy costs. After the air received via the supply duct 42 and/or return plenum 56 is directed at the heat exchanger 74, the air exits the cooling unit into the return plenum 56 through one or more openings in an enclosure (discussed below with respect to FIG. 3). Air may be sucked from return plenum 56 by a return duct (not shown).

Referring to FIGS. 3 and 4, the cooling unit 70 includes an enclosure 72, which is configured to be mounted within a ceiling space within the building (e.g., return plenum 56). In one embodiment, the enclosure 72 is fabricated from sheet metal. As shown, the enclosure 72 is configured to support or contain the heat exchanger 74, which provides coolant to cool ITE 76 provided proximate the cooling unit 70 within the data center. In one embodiment, a footprint of the enclosure 72 of the cooling unit 70 can replicate a shape and size of the ceiling tile, e.g., a two-foot by four-foot ceiling tile, and the enclosure can be configured to mount within the space above the drop ceiling in a traditional manner. For example, the enclosure 72 can be secured to infrastructure of the ceiling in a manner in which other cooling equipment is suspended in the ceiling. The enclosure may have one or more openings (e.g., mesh or grill) on at least one side (e.g., the side closest to the heat exchanger 74) so that air directed at the heat exchanger 74 may exit the enclosure.

Coolant within the heat exchanger 74 is connected to the ITE 76 by a supply line 78 that delivers cooled coolant from the heat exchanger to the ITE and a return line 80 that delivers warmed coolant from the ITE back to the heat exchanger. A pump 82, which is secured to the enclosure 72 of the cooling unit 70, is provided to drive the movement of the cooled coolant in the supply line 78 and/or the movement of the warmed coolant in the return line 80. The cooling cycle of coolant within the cooling unit 70 will be described in greater detail below.

Optionally, in one embodiment, one end of the enclosure 72 of the cooling unit 70 is configured to support a primary fan module 84, which is in fluid communication with the supply duct 42. Cooled air from the supply duct 42 is delivered to the supply inlet 85 of the enclosure 72 and directed toward the heat exchanger 74. In the shown embodiment, the supply inlet 85, e.g., an opening, is provided at an end of the enclosure 72, with the fan module 84 being positioned within the supply inlet. In one embodiment, the supply inlet 85 is provided at the beginning of the enclosure 72 where cool air from the supply duct 42 enters the enclosure. It should be understood that the fan module 84 can be positioned in other locations, such as within the supply duct 42. Moreover, the fan module 84 can be configured to draw return air from the return plenum 56 and direct the return air toward the heat exchanger 74. A damper 86 may be provided to control the volume of supply air entering the cooling unit 70 delivered from the supply duct 42 to the enclosure 72 of the cooling unit. The primary fan module 84 can operate to draw air from the cooled supply air as the primary cooling source for the heat exchanger 74 serving ITE coolant loop. The primary fan module 84 functions as an in-line inlet booster fan for the VAV air being delivered by the AHU. When the AHU is in an "off" condition, the primary fan module 84 may be operated to draw in air from the building at large as a cooling source of the heat exchanger 74 serving the cooling system of the ITE 76.

The sides of the enclosure 72 of the cooling unit 70 can include openings or slits, i.e., return inlets 88, which are positioned beneath the heat exchanger 74 to create an area of low pressure to draw additional warmed return air into the enclosure of the cooling unit, with the mixture being discharged through the heat exchanger into the greater volume defined by the plenum 56. In one embodiment, the return plenum 56 is positioned adjacent the cooling unit 70 to enable return air to flow into the enclosure 72 of the cooling unit through the return inlets 88 formed in the enclosure. The cooling unit 70 further includes a plurality of air amplifier nozzles, each indicated at 90, which perform a function similar to an air amplifier known in the industry. The air from the AHU provided by the supply duct 42, boosted as needed by the primary fan module 84, is the primary mover for all airflow through the heat exchanger 74. Air amplifier nozzles 90 may operate based on a Coanda effect. In some embodiments, ceiling return air may be pulled into air amplifier nozzles 90 by pressure created when supply air is pushed through the amplifier, e.g., by the primary fan module 84 and/or the AHU system 40.

During operation, when the cooling unit 70 is providing cooling to the ITE 76, cooled coolant is delivered to the ITE by the supply line 78 and used by the ITE to cool electronics equipment. As a result, the coolant within the conduit absorbs heat from the ITE 76, and the heated or warmed coolant is returned to the cooling unit 70 by the return line 80 where the warmed coolant is delivered to the heat exchanger 74 of the cooling unit. The warmed coolant is cooled within the heat exchanger 74 of the of the cooling unit 70 by the combination of cooled supply air that enters the enclosure 72 of the cooling unit by the supply duct 42 and the warmed return air that enters the enclosure of the cooling unit by the return plenum 56. Although warmer, the ceiling return air from the return plenum 56 is cooler than the warmed fluid delivered to the heat exchanger 74 by the return line 80 and thus capable of cooling the warmed fluid within the heat exchanger. As mentioned above, depending on operating conditions, a preferred proportion of supply air and return air to the cooling unit 70 is one-third (⅓) AHU supply air to two-thirds (⅔) return air. However, it should be understood that the proportion of the supply air and the return air can be modified to optimize the performance of the cooling unit 70. For example, the amount of supply air delivered to the cooling unit 70 can range from 0 to 100% of the total air delivered to the cooling unit. Similarly, the amount of return air delivered to the cooling unit 70 can range from 0 to 100% of the total air delivered to the cooling unit. The air amplifier nozzles 90 are controlled to enhance airflow through the enclosure 72 of the cooling unit 70.

As shown, the cooling unit 70 serves as a supply air intake connection to the cooled air supply duct 42 from the AHU system 40 and a secondary intake from a warmed air ceiling return plenum 56. The mixed airflow is discharged across a finned coil of the heat exchanger 74 of the cooling unit 70 where the mixed air absorbs heat of rejection from ITE 76. The heated air is then returned to the AHU system 40 for further cooling. The cooling unit 70, with integral pump 82 and hydronic accessories, has both a warm water return connection via return line 80 from the ITE 76 and a cool water supply connection via supply line 78 to the ITE.

In certain embodiments, a controller 92 may be employed to control the operation of the cooling unit 70. In one embodiment, the controller 92 is configured to control the operation of the fan module 84 to deliver supply air to the enclosure 72 of the cooling unit 10 and to control the operation of the amplifier nozzles 90 to deliver return air to the enclosure. The controller 92 can be configured to control other components of the cooling unit 10, such as the pump 82, and components of the VAV system 40, such as the damper 86. In one embodiment, the controller 92 may be a dedicated unit associated with the cooling unit 70. In another embodiment, the controller 92 may be provided as part of an integrated data center control and monitoring system associated with the cooling system including the AHU and the VAV units. In yet another embodiment, each cooling unit 70 may be independently operable by a controller provided in the cooling unit that is in communication with controllers of the other cooling units. Notwithstanding the particular configuration, the controller 92 is designed to control the independent operation of the cooling unit 70 within the data center.

In another embodiment, one cooling unit may operate as the main or master unit and the other cooling units operate as subservient units that operate under the control of the main unit. In this embodiment, the main cooling unit may be manipulated by the data center operator to control the entire cooling unit. For example, the controller may be configured to receive information from the cooling units so as to determine the amount of power being drawn by each unit. With this knowledge, the controller may be configured to increase the cooling capacity of certain cooling units within the combined racks based on the energy drawn by the combined racks.

In one embodiment, the controller 92 may embody only controller unit provided in the cooling units that communicate with one another over a controller area network (CAN) Bus. In other embodiments, a master controller may be provided to control the operation of the controller units. Changes to the environmental conditions, such as the temperature of the data center, results in changes of inputs including the temperature of the fluids flowing into and out of the cooling units 70.

Figure 5:
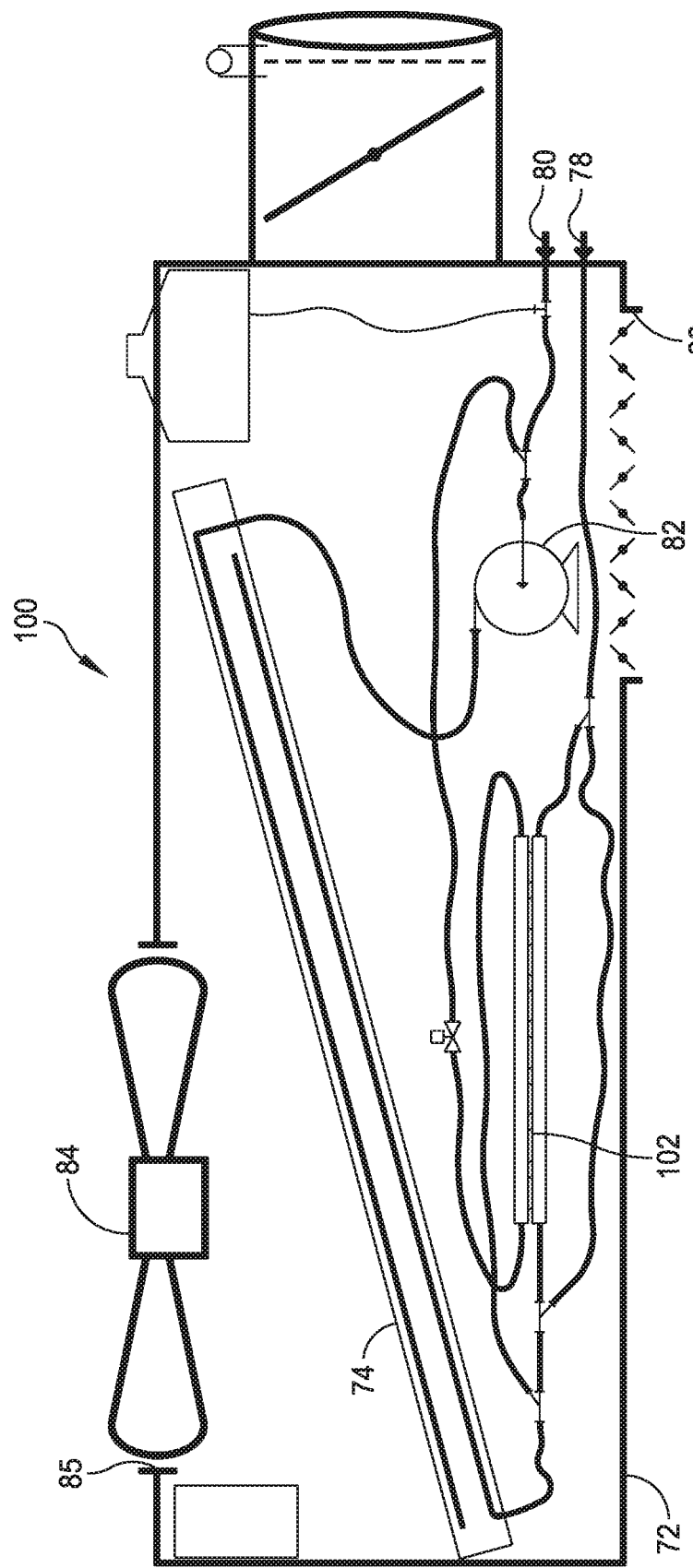
FIG. 5 is a schematic view of a cooling unit of another embodiment of the present disclosure.

Referring to FIG. 5, an alternate embodiment of a cooling unit, generally indicated at 100, includes supplemental cooling provided by a thermo electric cooler, e.g., a Peltier array, indicated at 102. All other parts of the cooling unit 100 are designated by the reference numbers used to designate similar parts in cooling unit 70. In one embodiment, the system further expands an operating range for the cooling unit 100 by means of integrated trim cooling with the active thermo electric cooler 102, which is controlled by the controller 92. This active cooling makes it possible to achieve a designated cooling temperature of coolant exiting the cooling unit 100 to the ITE at or even lower than mixed temperature building return air and VAV supply air. The supplemental cooling effect may easily be further boosted with the thermo electric coolers by increasing voltage and current to the array, with consequence of increased power supply capacity and lower coefficient of performance (COP) of the active cooling. However, a less efficient "high boost mode" may be justified for short durations with unusual operating conditions.

In some embodiments, the thermoelectric cooler can be configured from a plurality of modules containing a thermoelectric junction of dissimilar metals sandwiched between a pair of "cold plates." One cold plate on a hot side of the modules can have a portion of a somewhat cooled fluid leaving heat exchanger 74, which passes through a series of internal fluid channels. The fluid receiving heat of work and thermal energy is removed from the cold side. The other cold plate on a cold side of modules can have a remaining portion of the somewhat cooled fluid leaving heat exchanger 74, which passes through a series of internal fluid channels. The fluid is cooled by the Peltier effect of the thermoelectric junctions. The divided flows of partially cooled fluid from heat exchanger 74 is typically arranged in a counterflow configuration through the two cold plates.

In some embodiments, the cooling unit further includes the possibility for active cooling elements, e.g. a thermal electric cooling (TEC) unit, pump(s), controls, reservoir, Internet connectivity, etc., to fully support liquid cooled ITE.

Thus, it should be observed that the cooling unit of embodiments of the present disclosure is configured to receive cooled supply or supply air from the AHU and return or return air from the return plenum to cool fluid for cooling electronics equipment. The air amplifiers are configured to direct air from the AHU and the return plenum to the heat exchanger having a conduit containing fluid for cooling electronics equipment. The return air is pulled into the amplifiers by the pressure created when the AHU provides supply air through the amplifier. The primary fan module may be provided for both the supply air and the return air. The systems disclosed herein leverages energy already expended to cool a zone, e.g., to then cool the fluid in the conduit of the cooling unit.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A system to cool fluid used in information technology equipment (ITE), the system comprising:
    an enclosure including a supply inlet configured to receive supply air from an HVAC system, at least one return inlet configured to receive return air from a return plenum, and an opening configured to enable fluid communication between the enclosure and the HVAC system to return air from the enclosure to the return plenum; and
    a heat exchanger supported by the enclosure, the heat exchanger being in fluid communication with at least one ITE unit by a supply line configured to deliver cooled cooling fluid to the at least one ITE unit and a return line configured to deliver warmed cooling fluid to the heat exchanger,
    wherein the supply air is directed at the heat exchanger to cool the warmed cooling fluid provided by the at least one ITE unit.

2. The system of claim 1, further comprising a fan module configured to draw the supply air into the enclosure.

3. The system of claim 2, wherein the fan module is positioned within the supply inlet of the enclosure.

4. The system of claim 1, further comprising a fan module configured to draw the return air into the enclosure.

5. The system of claim 1, further comprising a damper configured to control a volume of the supply air entering the enclosure.

6. The system of claim 1, wherein a proportion of supply air from the HVAC system and return air from at least one zone to the enclosure is one-third (⅓) supply air to two-thirds (⅔) return air.

7. The system of claim 1, wherein the enclosure is configured to be mounted within a ceiling space.

8. The system of claim 1, wherein the at least one return inlet is positioned beneath the heat exchanger to create an area of low pressure to draw warmer return air into the enclosure.

9. The system of claim 1, further comprising at least one amplifier nozzle configured to direct the supply air to the heat exchanger.

10. The system of claim 9, wherein the at least one amplifier nozzle is controlled by a controller.

11. The system of claim 1, further comprising supplemental cooling provided by a thermo electric cooler.

12. The system of claim 11, wherein the thermo electric cooler is supported by the enclosure.

13. The system of claim 11, wherein the thermo electric cooler is controlled by a controller.

14. A method of installing the cooling system of claim 1 within the HVAC system, the method comprising:
    providing a cooling unit including the enclosure and the heat exchanger, the heat exchanger being configured to be in fluid communication with the at least one information technology equipment (ITE) unit by the supply line configured to deliver the cooled cooling fluid to the at least one ITE unit and the return line configured to deliver the warmed cooling fluid to the heat exchanger,
    wherein the enclosure of the cooling unit is configured to receive supply air from the HVAC system and to direct the supply air to the heat exchanger to cool the cooling fluid provided from the at least one ITE unit.

15. The method of claim 14, wherein the enclosure is further configured to receive return air from at least one zone.

16. The method of claim 15, wherein a proportion of supply air from the HVAC system and the return air from the at least one zone to the enclosure is one-third (⅓) supply air to two-thirds (⅔) return air.

17. The method of claim 15, wherein the cooling unit is configured to draw air from at least one of the supply air or the return air into the enclosure by a fan module.

18. The method of claim 14, wherein the cooling unit is configured to direct supply air to the heat exchanger by at least one air amplifier.

19. A system to cool fluid used in information technology equipment (ITE), the system comprising:
    a source of supply air including an inlet duct, a first heat exchanger in fluid communication with the inlet duct, and a supply duct in fluid communication with the first heat exchanger and a room containing at least one ITE unit, the supply duct being configured to deliver supply air to the room;

an enclosure including a supply inlet to receive supply air from the source of supply air, at least one return inlet configured to receive return air from a return plenum, and an opening configured to enable fluid communication between the enclosure and the return plenum, the enclosure being in fluid communication with the supply duct; and a second heat exchanger supported by the enclosure, the second heat exchanger being in fluid communication with the at least one ITE unit by a supply line configured to deliver cooled cooling fluid to the at least one ITE unit and a return line configured to deliver warmed cooling fluid to the second heat exchanger, wherein the supply air is directed at the second heat exchanger to cool the warmed cooling fluid provided by the return line.

\* \* \* \* \*